United States Patent

Hoogendoorn et al.

[15] 3,644,154

[45] Feb. 22, 1972

[54] METHOD OF FABRICATING SEMICONDUCTOR STRUCTURES WITH REDUCED CRYSTALLOGRAPHIC DEFECTS

[72] Inventors: Cornelius Hoogendoorn; Mattie Moody; Guenter H. Schwuttke, all of Poughkeepsie, N.Y.

[73] Assignee: International Business Machines Corporation, Armonk, N.Y.

[22] Filed: June 9, 1969

[21] Appl. No.: 831,675

[52] U.S. Cl. ....................148/187, 29/576, 148/1.5, 148/189

[51] Int. Cl. ....................H01l 7/44

[58] Field of Search ....................29/576; 148/1.5, 186, 187, 148/188, 189

[56] References Cited

UNITED STATES PATENTS 3,442,725 5/1969 Huffman et al. ....................148/189

3,484,662 12/1969 Hagon ....................148/175

3,498,853 3/1970 Dathe et al. ....................148/189

*Primary Examiner*—L. Dewayne Rutledge

*Assistant Examiner*—J. Davis

*Attorney*—Hanifin and Jancin and Julius B. Kraft

[57] ABSTRACT

A method of fabricating semiconductor structures and devices with reduced crystallographic defects by supporting said wafers in close proximity to a substrate which serves to maintain a linear temperature gradient across the surface of the wafer. The wafer is positioned so that one entire surface thereof is less than one-fourth inch and may be flush against the substrate which has a heat capacity of at least 10 times that of the wafer. The wafer is maintained in this position whenever it is at a temperature above 850° C. The wafer is so maintained during both the periods when such high-heat processing is being carried out, as well as when the wafer is removed from the source of heat and being cooled.

There is also provided a wafer holder having a plurality of spaced walls and means for supporting a plurality of wafers in the above-described positions between said walls.

6 Claims, 9 Drawing Figures

INVENTORS
CORNELIS HOOGENDOORN
MATTIE MOODY
GUENTER H. SCHWUTTKE

BY J. B. Kraft
ATTORNEY

OXIDIZED
PROCESSED VERTICALLY

OXIDIZED
PROCESSED FLAT

DIFFUSED
PROCESSED VERTICALLY

DIFFUSED
PROCESSED FLAT

METHOD OF FABRICATING SEMICONDUCTOR STRUCTURES WITH REDUCED CRYSTALLOGRAPHIC DEFECTS

BACKGROUND OF THE INVENTION

1. Field of the Invention

The present invention relates to an improved method of forming planar semiconductor structures by diffusion of conductivity-determining impurities into the surface of semiconductor wafers through openings in a mask of insulating material.

2. Description of the Prior Art

The ever increasing miniaturization of semiconductor structures, such as devices or integrated circuits, provides the basis for the major advances in the microelectronics art. Such miniaturization aims to achieve lower fabrication costs, greater component density and increased component reliability. The planar fabrication technique is the most commonly used at present. It involves a series of successive formations of insulating masks on the surface of a semiconductor wafer and diffusions of conductivity-determining impurities through said masks. The wafer is then cut into chips containing either discrete devices or integrated circuits. The trend has been in the direction of smaller, discrete devices or circuit elements on larger chips containing integrated circuits having increasing numbers of devices. Further, in order to lower production costs and to efficiently accommodate the larger chips, the diameters of wafers have been increasing. In the immediate future, it is expected to be common practice to employ wafers having diameters of from 2 inches to 3 inches and greater as compared to the wafer sizes in the order of from 1 inch to 1½ inches which are presently in use.

With the increasing density of circuit elements and devices per wafer, the problem of crystallographic defects, such as strain-induced dislocations, has become increasingly significant. The problem of crystallographic defects has been recognized in the past. These defects appear to be primarily dislocations in the crystals caused by strains resulting from the heating of the wafer and mechanical handling of the wafer during the processing. However, when the chips to be formed from the wafer contain either discrete devices or simple integrated circuits with relatively few devices and circuit elements, it is not critical that the dislocation problem be controlled. This is due to the fact that if dislocations in certain areas of the wafers rendered some of the chips inoperative, there is still a sufficient number of unaffected chips available for use in areas without dislocations, and the resultant loss in yield, though significant, does not become critical. However, with integrated circuits of increasing device density on wafers to be divided into individual chips having hundreds of components, the problem becomes more significant and whenever a crystallographic defect renders a chip inoperative, a complex integrated circuit with hundreds of elements would thereby be rendered inoperative. In addition, in wafers having diameters in excess of 2 inches, crystallographic defects become more pronounced and greater in quantity.

SUMMARY OF THE INVENTION

Accordingly, it is the primary object of the present invention to provide a method of fabricating planar semiconductor structures in which crystallographic defects are minimized.

It is a further object of this invention to provide such a method for minimizing crystallographic defects in monolithic integrated semiconductor structures.

It is another object of this invention to provide a method of minimizing crystallographic defects in planar semiconductor structures resulting from fabrication steps involving oxidation and diffusion at temperatures in excess of 1,100° C.

It is yet another object of this invention to provide a holder for semiconductor wafers utilized in high heat fabrication steps to minimize crystallographic defects arising from these steps.

We have recognized that the primary cause of crystallographic defects, such as dislocations in wafers, is the application of high heat in excess of 1,100° C. often, for periods of several hours, during the surface oxidation steps and the diffusion steps of conventional planar semiconductor structure fabrication. During such diffusion and oxidation steps, it is conventional practice to mount the wafers in a holder in which the wafers stand upright supported at their lower end, spaced from each other in a file or row. The wafer holder is made of a refractory material such as quartz. The holder containing the wafers is placed in a conventional reaction housing, e.g., closed tube or open tube, and the entire housing is inserted into an oven.

We have found that with wafers mounted in this conventional manner, it is not possible to maintain a regular or linear temperature distribution across a surface of the wafer, particularly during the cooling of wafers heated in excess of 1,100° C.; irregular or nonlinear temperature gradients arise across the surface of the wafer. For example, during the cooling the portions of the wafer contacting the holder appear to cool more slowly than other portions of the wafer, and the center of the wafer also appears to cool at a slower rate than the exposed end portions of the wafer. The irregular expansions and contractions in varying portions of the wafer caused by the irregular temperature gradient result in stresses which in turn cause the crystallographic defects.

We have been able to substantially eliminate such crystallographic defects by maintaining the wafer, during such high heat oxidation and diffusion steps, in a position wherein at least one entire surface of wafer is less than one-fourth inch from a substrate having a heat capacity of at least 10 times that of the wafer. Heat capacity is defined as the mass of the substrate times the amount of heat necessary to raise 1g. of the substrate material 1°. The substrate acts to effect a linear temperature distribution across the surface of the wafer, particularly during cooling, thereby eliminating the thermal stresses which cause the crystallographic defects. The wafer surface may be spaced from the substrate or in contact with the substrate. When the surface is in contact with the substrate, it is not desirable to have only part of a surface in contact with the substrate. Accordingly, the entire surface is preferably in flush contact with the substrate, or the wafer is mounted so that only its periphery touches the substrate. In the situation where only part of the wafer surface touches the substrate, an irregular temperature gradient may arise which produces crystallographic defects in the region of the wafer contacting the substrate.

Apparatus is provided for supporting the wafer in the above-described position. In this apparatus, a series of wafers is supported, spaced from each other with a series of walls in the spaces between the wafers. The walls which have a heat capacity of at least 10 times that of the wafer function as the above-described substrates, with the wafers being mounted so that one entire surface of each wafer is less than one-fourth inch from a wall. The wafers may be positioned substantially upright, in which case the holder is a comblike structure.

The foregoing and other objects, features and advantages of the invention will be apparent from the following more particular description and preferred embodiments of the invention as illustrated in the accompanying drawings.

DESCRIPTION OF THE PREFERRED EMBODIMENTS

Figure 1A:
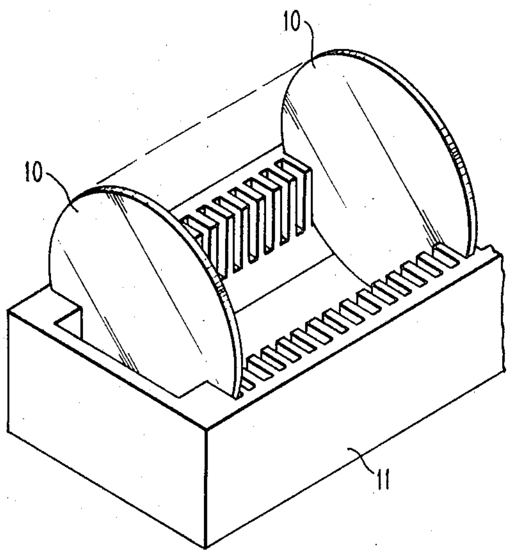
FIG. 1A is a diagrammatic sketch of a conventional upright wafer-supporting structure.
Figure 1B:
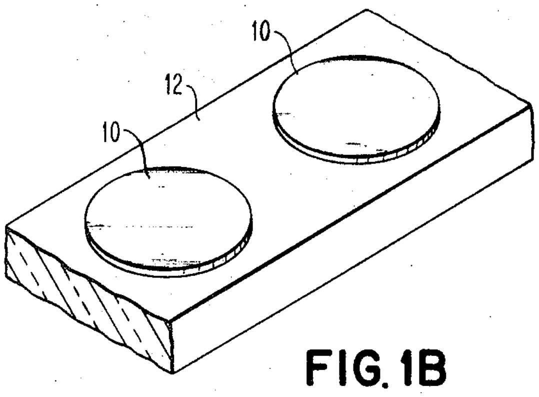
FIG. 1B is a diagrammatic sketch of a section of a rudimentary wafer-supporting structure which may be utilized in the process of the present invention.

In order to illustrate the principles of the present invention, the following comparison is made: a group of 2¼ inches diameter silicon wafers of P-type conductivity, preferably having a resistivity of about 15 ohms-cm. and an orientation of <111>, are mounted in a conventional holder or quartz boat, FIG. 1A, wherein the wafers 10 are supported upright in the boat 11 in a file or row. Another group of identical wafers 10, FIG. 1B, are mounted flush against a relatively thick quartz slab 12, in which each of the wafers covers a portion of the slab having a heat capacity of at least 10 times that of wafer; the heat capacity is the mass of the substrate covered times the heat required to raise 1g. of the substrate material 1°. Next, both the wafers mounted in the arrangement of FIGS. 1A and 1B are processed to grow thermal oxides on the surface of the wafers in the conventional manner by placing each of the two groups of wafers in open-ended quartz enclosures and maintaining each of the enclosures at a temperature of 1,200° C., while the wafers are exposed to gas in the following time cycles:

5 minutes oxygen and 10 minutes steam.

A $SiO_2$ layer is formed over the surfaces of each of the wafers. At the completion of the oxidation, the mounted wafers are removed from the capsule and permitted to cool to room temperature. If the wafer is to be processed further, it need not be cooled to room temperature. Cooling to below 850° C. will be sufficient.

Figure 5A:
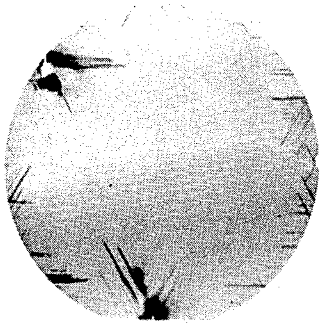
FIG. 5A is a SOT X-ray topograph of a wafer oxidized while mounted in the conventional apparatus of FIG. 1A.
Figure 5B:
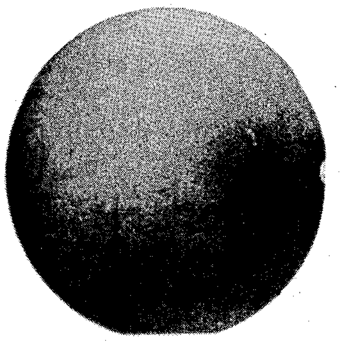
FIG. 5B is a SOT X-ray topograph of a wafer oxidized while mounted as shown in FIG. 1B.
Figure 5C:
FIG. 5C is a SOT X-ray topograph of a wafer diffused into while mounted in the apparatus of FIG. 1A.
Figure 5D:
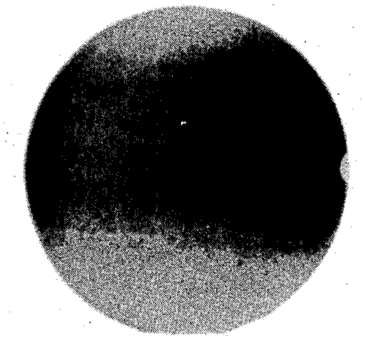
FIG. 5D is a SOT X-ray topograph of a wafer diffused into while mounted as shown in FIG. 1B.

Representative samples of a wafer supported in the conventional manner, shown in FIG. 1A, and a wafer supported against a heat capacity substrate, shown in FIG. 1B, are selected. Then, using the Scanning Oscillator Technique (SOT) developed by G. H. Schwuttke and described in Journal of Applied Physics, Vol. 36, No. 9, pp. 2,712–2,721, Sept. 1965, photomicrographs of the SOT X-ray topographs of a surface on each of the two wafers are prepared. The topograph of the wafer prepared using the support of FIG. 1A is shown in FIG. 5A, and the topograph of the wafer supported on the substrate of 1B is shown in FIG. 5B. A comparison of the two topographs clearly shows a marked reduction in the crystallographic dislocations in the wafer of FIG. 5B. Dislocations appear as irregular striations on the topograph. Next, two 2¼ inch diameter wafers identical to those described above are selected. One of the wafers is then mounted in the apparatus of FIG. 1A, and the other on a substrate as shown in FIG. 1B. Then, a closed tube boron diffusion is performed into the exposed silicon surface on each of the pair of wafers by enclosing each of the supported wafers in a closed quartz capsule containing a boron source and maintaining each of the capsules at 1,200° C. for a period of 95 minutes. At this temperature, the boron source provides the wafers with a $c_o$ (surface concentration) of $5\times10^{20}$ cm.$^{-3}$. The mounted wafers are then removed from the capsule and permitted to cool to room temperature. Then, using the previously described Scanning Oscillator Technique (SOT), topographs are prepared for each of the wafers. The wafer which is diffused into while mounted on the apparatus of FIG. 1A has the topographs shown in FIG. 5C, and the wafer which is diffused into while mounted on the substrate shown in FIG. 1B has the topographs shown in FIG. 5D. A comparison of these two topographs shows that the wafer of 5D has minimal crystallographic dislocations as compared to the wafer of 5C.

The above procedure is intended merely to be illustrative of effectiveness of the method of the present invention in minimizing crystallographic defects during typical high heat diffusion and/or oxidation steps carried out at temperatures in excess of 1,100° C. We have found that the results are substantially the same as illustrated in any of the conventional diffusion steps such as subcollector, base, emitter and isolation used in planar integrated circuit fabrication or any oxidation or reoxidation steps in such fabrication when such steps are carried out at high heat above 1,100° C.

Figure 2:
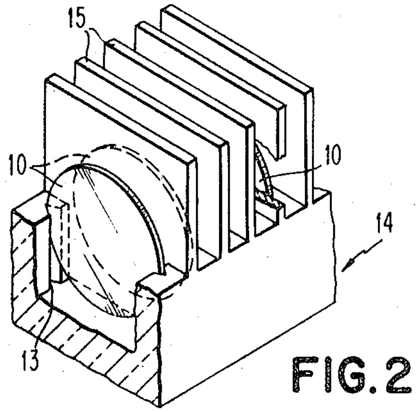
FIG. 2 is a diagrammatic sketch of a fragment of one embodiment of wafer-supporting apparatus.
Figure 3:
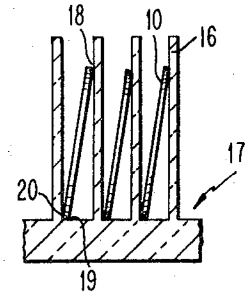
FIG. 3 is a diagrammatic, fragmentary, cross-sectional view of a variation in the embodiment of the wafer-supporting structure.
Figure 4:
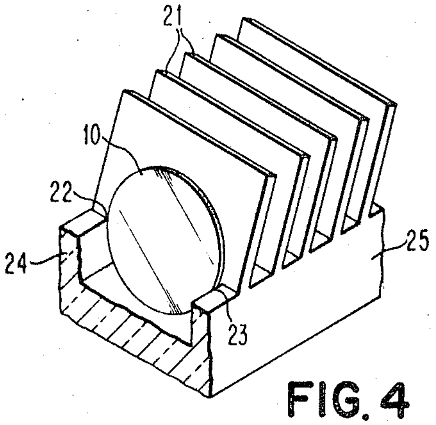
FIG. 4 is a fragmentary, diagrammatic sketch of another embodiment of the wafer-supporting structure of the present invention.

While the substrate in FIG. 1B illustrates a basic embodiment of the present invention, for many commercial uses wafer-supporting means which accommodate a large number of wafers in a minimum space are desirable. The structures of FIGS. 2, 3, and 4 illustrate embodiments of such wafer supports in accordance with the present invention. In the supporting structure shown in FIG. 2, the wafers 10 are seated substantially upright with each wafer being retained in a pair of V-shaped opposing slots 13 formed in the base section of quartz boat 14. The pair of slots engage the wafer at four points on the wafer periphery with the walls of each slot contacting the wafer at only one point on the upper surface periphery and one point on the lower surface periphery. Spaced lateral walls 15 separate the wafers, and are positioned so that at least one entire surface of each wafer is less than one-fourth inches from a lateral wall. The walls have a heat capacity such that the portion of the wall falling within the projection of the periphery of the proximate wafer surface has a heat capacity of at least 10 times that of the wafer. The distance given between the proximate wafer surface and the lateral wall is a maximum distance at which a linear temperature gradient may be maintained across the wafer. In order to achieve maximum commercial efficiency and rate of productivity, it is desirable to have the walls as close to the wafers as will permit convenient loading and unloading of the wafers from the boat.

In this connection, FIG. 3 illustrates another embodiment of wafer-supporting structure. Spaced walls 16 project from the base of quartz boat 17 to form a comblike structure. The wafers instead of being nested are merely deposited between walls 16 and, thus, are seated with three peripheral points touching the support, namely points 18, 19 and 20. The previously described maximum distances of the entire wafer surfaces from the wall, as well as the heat capacity of the lateral wall, still apply to this structure.

A further embodiment of the wafer-supporting structure of the present invention is shown in FIG. 4. In this structure, walls 21 are slanted so that the wafers 10 rest flush against the walls, each wafer being engaged at peripheral points 22 and 23, respectively, by base sides 24 and 25. The walls have the previously described heat capacity.

While quartz has been used for the substrates and walls in the illustrative embodiments of the present invention, any refractory material which can withstand heat above 1,100° C. and does not react with the wafers at such temperatures may be used if it is capable of being formed into walls of substrates with the requisite heat capacity of at least 10 times that of the wafer. Other refractory materials having the requisite properties are silicon, silicon carbide and carbon.

Although the process of the present invention minimizes crystallographic defects in wafers heated and/or diffused at temperatures in excess of 1,100° C., our process yields even more remarkable results in wafers processed above 1,150° C. and particularly above 1,200° C. It is at these very high temperatures that wafers processed in the conventional manner manifest rather extensive crystallographic defects. On the other hand, wafers processed at these high temperatures, in accordance with the present invention, still display minimal crystallographic defects.

While the invention has been particularly shown and described with reference to preferred embodiments thereof, it will be understood by those skilled in the art that the foregoing and other changes in forms and details may be made therein without departing from the spirit and scope of the invention.

What is claimed is:

1. In the method of forming planar semiconductor structures by high temperature semiconductor processes; the improvement comprising:

minimizing the variation of temperature distribution across a semiconductor wafer from a linear relationship by maintaining said wafer at said high temperatures in a position relative to a carrier therefor and having a heat capacity of at least 10 times that of the wafer, in which position one entire surface of the wafer is less than one-fourth inch from an adjacent support surface of said carrier, and wherein in said position only the periphery of the wafer surface is in point contact with the carrier surfaces; and maintaining the wafer in said position while the wafer is being cooled after processing at said high temperatures.

2. In the method of forming planar semiconductor structures by high temperature semiconductor processes, the improvement comprising:

minimizing the variation of temperature distribution across the semiconductor wafer from a linear relationship by maintaining said wafer at said high temperatures in a position relative to a carrier therefor and having a heat capacity of at least 10 times that of the wafer, in which position one entire surface of the wafer is less than one-fourth inch from an adjacent support surface of said carrier, and wherein in said position the wafer planar surfaces do not contact the carrier surfaces; and maintaining the wafer in said position while the wafer is being cooled after processing at said high temperatures.

3. In the method of forming planar silicon semiconductor structures by high temperature semiconductor processes, including formation of an oxide layer on a surface of a silicon wafer at said high temperature, the improvement comprising:

minimizing the variation of the temperature distribution across a semiconductor wafer from a linear relationship by maintaining said wafer at said high temperature in a position relative to a carrier therefor and having a heat capacity of at least 10 times that of the wafer in which position one entire surface of the wafer is less than one-fourth inch from an adjacent supporting surface of said carrier, and wherein in said position only the periphery of the wafer is in point contact with the carrier surfaces; and maintaining the wafer in said position while the wafer is being cooled after processing at said high temperature.

5. In the method of forming planar silicon semiconductor structures by high temperature semiconductor processes, including formation of an oxide layer on a surface of a silicon wafer at said high temperatures, the improvement comprising:

minimizing the variation of the temperature distribution across a silicon semiconductor wafer from a linear relationship by maintaining said wafer at said high temperature in a position relative to a carrier therefor and having a heat capacity of at least 10 times that of the wafer, in which position one entire surface of the wafer is less than one-fourth inch from an adjacent supporting surface of said carrier, and wherein in said position the wafer planar surfaces do not contact the carrier surfaces; and maintaining the wafer in said position while the wafer is being cooled after processing at said high temperature.

4. The method of claim 3 wherein an opening is formed in said oxide layer followed by high temperature diffusion of conductivity-determining impurities into said wafer through said opening.

6. The method of claim 5 wherein an opening is formed through said oxide layer followed by high temperature diffusion of conductivity-determining impurities into said wafer through said opening.

* * * * *